US009865141B2

(12) United States Patent
Truong et al.

(10) Patent No.: US 9,865,141 B2
(45) Date of Patent: Jan. 9, 2018

(54) PROVIDING A BIOS PULSE SIGNAL FOR OPENING A CASH DRAWER

(75) Inventors: Binh T Truong, Houston, TX (US); Nam Nguyen, Houston, TX (US); Larry W Kunkel, Spring, TX (US); Gregory P Ziarnik, Houston, TX (US); Michael R Durham, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 996 days.

(21) Appl. No.: 13/423,961

(22) Filed: Mar. 19, 2012

(65) Prior Publication Data

US 2013/0246198 A1 Sep. 19, 2013

(51) Int. Cl.
*H03K 5/13* (2014.01)
*G07G 1/00* (2006.01)

(52) U.S. Cl.
CPC ......... *G07G 1/0009* (2013.01); *G07G 1/0027* (2013.01)

(58) Field of Classification Search
CPC ...................................................... H03K 17/28
USPC ............................................................ 705/16
See application file for complete search history.

(56) References Cited

U.S. PATENT DOCUMENTS 3,889,197 A * 6/1975 Duff ........................ H03K 5/13 327/266
3,999,681 A * 12/1976 Graef ................. G07D 11/0003 221/266
4,066,308 A * 1/1978 Wedel ................... E05B 65/461 312/219
4,120,013 A * 10/1978 Simmons ................ D06F 37/42 361/180
4,282,424 A * 8/1981 Hirose .................... G07F 19/20 235/379
4,603,239 A 7/1986 Ishii
4,811,579 A * 3/1989 Lyons ................ E05B 47/0002 312/333
4,903,200 A * 2/1990 Mook, Jr. ............. G06Q 20/20 705/25
5,111,394 A * 5/1992 Hilles .................... G06Q 20/20 109/39
5,723,850 A * 3/1998 Lambert ............. G07G 1/0027 200/DIG. 38
5,764,480 A * 6/1998 Crump .................... G06F 1/181 312/223.2
6,609,204 B1 8/2003 Olarig et al.
(Continued)

FOREIGN PATENT DOCUMENTS

TW 200928070 A 7/2009

*Primary Examiner* — Talia Crawley
(74) *Attorney, Agent, or Firm* — Mahamedi IP Law LLP

(57) ABSTRACT

A system is disclosed that includes memory resources and one or more processing components coupled to the one or more memory resources. At least one of the memory resources stores a basic input/output system (BIOS). The one or more processing components are coupled to the memory resources to run a program for operating a point-of-sale (POS) terminal. The program enables a user to provide an input to open a cash drawer. A controller circuit receives a signal from the BIOS when the user provides the input and generates a pulse signal having a predetermined duration to cause a voltage signal to be transmitted to a solenoid of the cash drawer. The voltage signal causes the solenoid to change states in order to open the cash drawer.

18 Claims, 3 Drawing Sheets

(56) References Cited

U.S. PATENT DOCUMENTS

| | | | | |
|---|---|---|---|---|
| 6,788,997 | B1 | 9/2004 | Frederick | |
| 6,814,281 | B2 * | 11/2004 | Anderson ............ | G07G 1/0027 235/22 |
| 7,103,785 | B2 * | 9/2006 | Green ................... | G06F 1/3209 713/2 |
| 7,233,478 | B2 * | 6/2007 | Lum ........................ | G07G 5/00 361/152 |
| 7,264,150 | B1 * | 9/2007 | Moreland ............... | E05G 7/001 194/206 |
| 8,502,690 | B2 * | 8/2013 | Takizawa ............. | G07G 1/0027 235/22 |
| 8,740,057 | B2 * | 6/2014 | Stoops ................. | G07G 1/0027 235/375 |
| 2005/0140321 | A1 * | 6/2005 | Wojciak, Jr. ....... | G07C 9/00182 318/452 |
| 2005/0223245 | A1 * | 10/2005 | Green ....................... | G06F 1/26 713/300 |
| 2010/0134243 | A1 | 6/2010 | Colley, III et al. | |

* cited by examiner

PROVIDING A BIOS PULSE SIGNAL FOR OPENING A CASH DRAWER

BACKGROUND OF THE INVENTION

Point-of-sale (POS) terminals are used for performing financial transactions at various locations, such as stores, markets, and restaurants. When performing a financial transaction using physical currency, a user of a POS terminal must be able to access a cash drawer to remove and/or put in currency.

BRIEF DESCRIPTION OF THE DRAWINGS

The disclosure herein is illustrated by way of example, and not by way of limitation, in the figures of the accompanying drawings and in which like reference numerals refer to similar elements, and in which.

DETAILED DESCRIPTION

Figure 1:
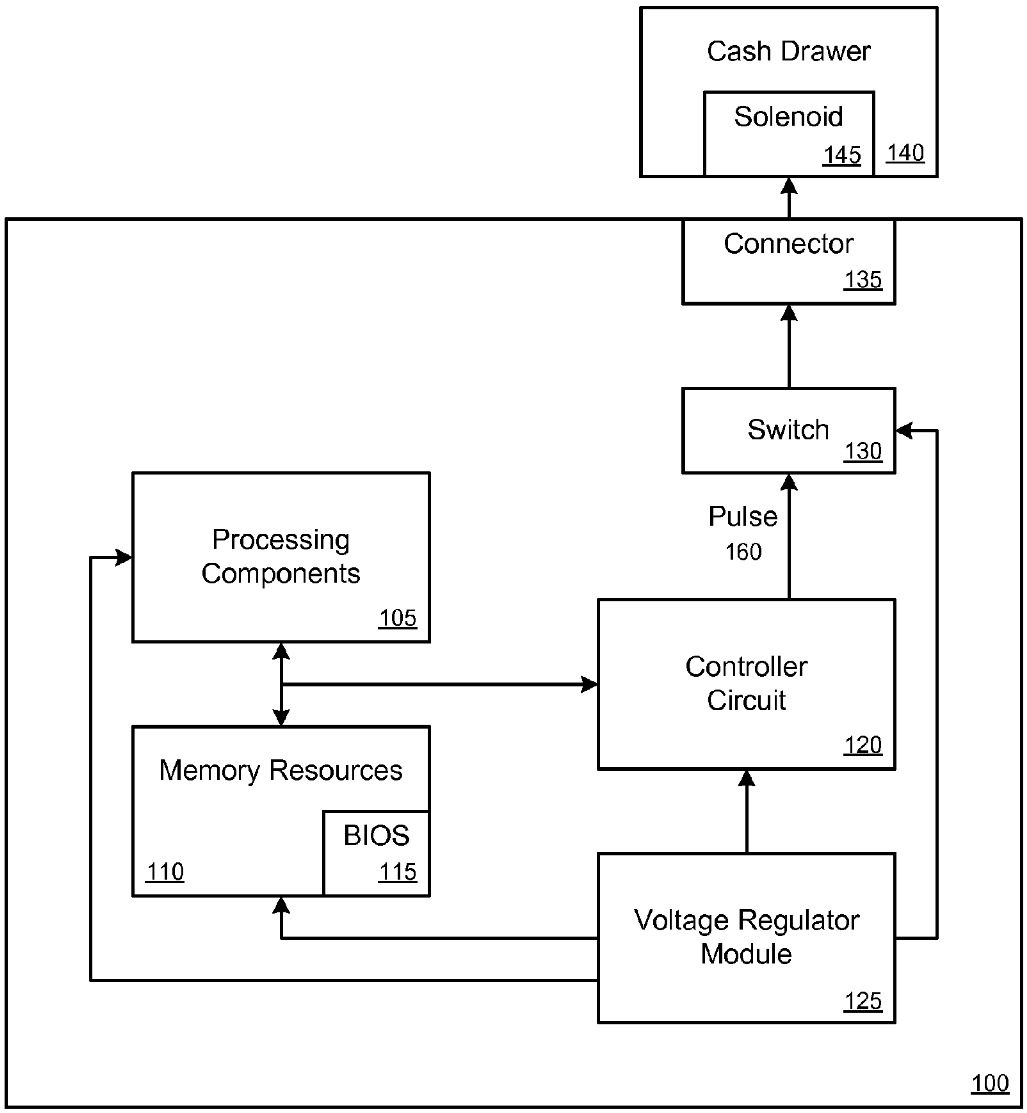
FIG. 1 illustrates an example system for providing a BIOS pulse control for a point-of-sale terminal, under an embodiment.

Embodiments described herein include a system for operating a point-of-sale (POS) terminal. The system can be included in or be part of the POS terminal. The system enables a controller circuit, such as a super I/O (input/output) integrated circuit, to control a pulse signal for opening a cash drawer that is provided with or coupled to the POS terminal. A user can adjust the pulse time depending on user preference via the basic input/output system (BIOS) of the system.

According to an embodiment, the system includes one or more memory resources and one or more processing components. At least one of the one or more memory resources stores a BIOS. The one or more processing components are coupled to the one or more memory resources to run a program for operating the POS terminal. The program enables a user of the POS terminal to provide an input in order to open a cash drawer that is included with and/or connected to the POS terminal. When the user provides the input, a controller circuit receives a signal from the BIOS and generates a pulse signal, which has a predetermined duration, to cause a voltage signal to be transmitted to a solenoid of the cash drawer. The voltage signal causes the solenoid to change states in order to open the cash drawer.

In some embodiments, the controller circuit includes an internal clock or timer that can used to configure or adjust the predetermined duration of the pulse signal generated by the controller circuit. The user of the POS terminal can configure the pulse signal through the BIOS settings depending on user preference or need. The BIOS settings can be accessed via a user interface feature that is provided on a display.

In another embodiment, a switch is connected to the controller circuit. The controller circuit causes the voltage signal to be transmitted to the solenoid of the cash drawer using the switch. A physical interface is coupled to the switch and the solenoid of the cash drawer is coupled to the physical interface to receive the voltage signal that causes the cash drawer to be opened. In some embodiments, the switch can be a transistor.

The system can also include a display screen and one or more input mechanisms, such as a keyboard, bar code scanner, or mouse, that are coupled to various connectors of the system. This enables the user to operate the system and access various user interfaces of the program for operating the POS terminal or the BIOS settings.

Some embodiments described herein may be implemented using programmatic elements, often referred to as modules or components, although other names may be used. Such programmatic elements may include a program, a subroutine, a portion of a program, or a software component or a hardware component capable of performing one or more stated tasks or functions. As used herein, a module or component, can exist on a hardware component independently of other modules/components or a module/component can be a shared element or process of other modules/components, programs or machines. A module or component may reside on one machine, such as on a client or on a server, or a module/component may be distributed amongst multiple machines, such as on multiple clients or server machines. Any system described may be implemented in whole or in part on a server, or as part of a network service. Alternatively, a system such as described herein may be implemented on a local computer or terminal, in whole or in part. In either case, implementation of system provided for in this application may include the use of memory, processors and network resources, including data ports, and signal lines (optical, electrical, etc.), unless stated otherwise.

One or more embodiments described herein provide that methods, techniques, and actions performed by a computing device or a system are performed programmatically, or as a computer-implemented method. Programmatically means through the use of code, or computer-executable instructions. A programmatically performed step may or may not be automatic.

Some embodiments described herein may be implemented through the use of instructions that are executable by one or more processors. These instructions may be carried on a computer-readable medium. Machines shown in figures below provide examples of processing resources and computer-readable mediums on which instructions for implementing embodiments of the invention can be carried and/or executed. In particular, the numerous machines shown with embodiments of the invention include processor(s) and various forms of memory for holding data and instructions. Examples of computer-readable mediums include permanent memory storage devices, such as hard drives on personal computers or servers. Other examples of computer storage mediums include portable storage units, such as CD or DVD units, flash memory, read-only memory (ROM), and magnetic memory. Computers (such as personal computers (PCs)), terminals, network enabled devices (e.g., mobile devices such as cell phones) are all examples of machines and devices that utilize processors, memory, and instructions stored on computer-readable mediums.

Overview

FIG. 1 illustrates an example system for providing a BIOS pulse control for a point-of-sale terminal, under an embodiment. System 100 can be provided with a point-of-sale (POS) terminal for enabling user to operate the POS terminal for performing financial transactions. According to an embodiment, system 100 includes one or more processing components 105 that are coupled to one or more memory resources 110. System 100 also includes a controller circuit 120, a voltage regulator module 125, and a switch 130. System 100 enables the controller circuit 120 to control a pulse signal 160 for opening a cash drawer 140 that is provided with or coupled to the POS terminal. The pulse signal 160 can be controlled by the BIOS 115 via the controller circuit 120. In some embodiments, a connector 135 (e.g., RJ12 connector network interface) is coupled to the switch 130 and provides an interface for connecting the system 100 to the cash drawer 140 and the solenoid 145. The cash drawer 140 may be included with or be part of the POS terminal, or may be separate and connected to the connector 135 (e.g., manufactured by a third party) via a cable, such as a network cable or a telephone cable.

In some embodiments, system 100 includes a plurality of connectors (e.g., physical interfaces and/or ports). The plurality of connectors can include registered jacks (RJ12, RJ45, etc.), serial ports, parallel ports, etc. A variety of different devices can connect with system 100 via the plurality of connectors, such as a display device (via a video graphics array) or input mechanisms (e.g., a mouse, a keyboard, a barcode scanner, a credit card reader, etc.).

The one or more processing components 105 can include, for example, a central processing unit (CPU) and/or a chipset for controlling communications between the CPU and other devices of system 100. The one or more memory resources 110 can include memory devices, such as random access memory (RAM), flash memory, read-only memory (ROM), hard drives, or other volatile or non-volatile memory devices. The one or more memory resources 110 can store instructions and/or programs that are executable by the one or more processing components 105 for running a POS platform (e.g., an operating system for the POS terminal) and/or one or more programs for operating the POS terminal. Other components/devices that are part of system 100 and processing components 105 are not illustrated in FIG. 1 for simplicity purposes.

In some embodiments, at least one of the one or more memory resources 110 also stores a basic input/output system (BIOS) 115. The BIOS 115 can be stored in, for example, a non-volatile memory device (e.g., flash memory or ROM). The BIOS 115 performs a power-on self test for initializing and identifying system devices when the system 100 is turned on, and loads the operating system (OS) of the system 100. The BIOS 115 also includes a user-interface feature (that can be presented on a display devices) to enable a user to access various settings for configuring hardware/devices of the system 100 (e.g., enable or disable various system components or set passwords, changing system clock).

System 100 also includes a controller circuit 120 that is coupled to the one or more processing components 105 and the one or more memory resources 110. According to an embodiment, the controller circuit 120 can provide interfaces for a variety of different devices for the system 100, such as serial ports, parallel ports, or physical interfaces 150 (e.g., for input mechanisms such as a mouse, or keyboard), so that the one or more processing components 105 can interface with the various devices. In some embodiments, the controller circuit 120 can be a super I/O (input/output) integrated circuit.

According to an embodiment, system 100 includes a voltage regulator module 125 for providing power to system 100. In particular, the voltage regulator module 125 provides different amounts of voltage to different components of system 100 (e.g., 1.5V, 1.8V, 3.3V, 5V, 12V, 24V). For example, the voltage regulator module 125 can supply voltage to one or more processing components 105 by lowering or increasing voltages (e.g., converting from 5V to 1.5V). The voltage regulator module 125 also provides an amount of voltage to the switch 130 (e.g., 24V) that is sufficient to cause the solenoid 145 of the cash drawer 140 to change states. When the solenoid 145 changes states (e.g., latches or unlatches), the cash drawer 140 can be popped open.

When a user operates system 100 for performing a financial transaction on a POS terminal, the user can access one or more programs that are provided by the processing components 105 and the memory resources 110. For example, the program(s) and/or OS of system 100 can enable the user to scan product barcodes via a barcode reader, can automatically and programmatically perform calculations (e.g., compute discounts, adding totals, tax computations), can automatically and programmatically cause a receipt to be printed from an attached printer, can keep an inventory of items purchased, etc. The user (e.g., such as a cashier at a supermarket) can also operate the program(s) and/or the OS of system 100 to receive payment from a buyer. Typically, payment is provided via cards (credit, debit, gift card) or checks, and commonly through physical currency, such as bills and coins.

In some embodiments, the user of system 100 can provide an input via a keyboard or a mouse, for example, when he or she wants to open the cash drawer 140 that is connected with or part of the POS terminal. In another embodiment, the program(s) and/or OS of system 100 can programmatically signal the cash drawer 140 to open when the transaction is completed (e.g., the user receives ten dollars and inputs the amount when the total cost is eight dollars, or the buyer pays with a card but asks for cash back). By opening the cash drawer 140, the user can add in and/or remove physical currency when receiving payment and/or returning change. When the user provides an input to open the cash drawer 140, the program and/or OS of system 100 signals or notifies the BIOS 115 of the input to open the cash drawer 140. The BIOS 115 detects this input and signals the controller circuit 120 to send a pulse signal 160 to the switch 130 (e.g., the BIOS 115 can flip a bit in the controller circuit 120). The pulse signal 160 is a signal that has a predetermined duration (e.g., logical low, then logical high for 150 ms, and then back to logical low).

As discussed above, the switch 130 receives a voltage (e.g., 24V) from the voltage regulator module 125, so that when the pulse signal 160 is received from the controller circuit 120, the switch 130 changes states (e.g., changes from off to on, or vice versa) for a duration of time, such as 150 ms (e.g., for the duration of the pulse signal 160 provided by the controller circuit 120). In one embodiment, the switch 130 can be a transistor (e.g., the gate of the transistor being connected to the controller circuit 120) or a multi-state switch. When the switch 130 changes states for the duration of time, the switch 130 enables the voltage signal (e.g., 24V) to be transmitted to the solenoid 145 of the cash drawer 140 via the connector 135 for the duration of the pulse signal 160. The voltage signal is an amount that is sufficient to cause the solenoid 145 to change states in order to open the cash drawer 140. In this manner, the BIOS 115 controls the controller circuit 120 to send the pulse signal 160 to the switch 130 in order to control the voltage being sent to the solenoid 145.

The solenoid 145 is a coil that is would into a helix that produces a magnetic field when electric current passes through it. A variety of different solenoids can be used in the cash drawer 140. For example, solenoid 145 can be an electromechanical solenoid or a rotary solenoid so that a plunger or latch can be moved when enough voltage is provided to the solenoid 145. The cash drawer 140 includes the solenoid 145 and a springing mechanism, for example, to enable the cash drawer 140 to pop out when the plunger or latch is unlatched due to the solenoid 145 receiving a voltage for a sufficient period of time (e.g., 24V).

By enabling the BIOS 115 to control the voltage being applied to the solenoid 145, a fail safe feature is provided to prevent the solenoid 145 from burning out or from excessive heating. In this way, for example, the one or more processing components 105 do not control the voltage that is being applied to the solenoid 145. Because the controller circuit 120 provides the pulse signal 160 with a predetermined duration (in response to the BIOS flipping a bit in the controller circuit), voltage can be prevented from being applied to the solenoid 145 (via the switch 130 and connector 135) after the duration of the pulse signal 160. In cases where system 100 has a software hang-up condition (e.g., frozen program and/or OS, "blue screen of death," system lock, application crash), voltage will not continue to be applied to the solenoid 145 because the signal to cause the controller circuit 120 to provide the pulse 160 is controlled by the BIOS 115. This results in extending the life expectancy of the solenoid 145, preventing fires from the solenoid 145 overheating, and reducing normal wear and tear from excess voltage being continually applied to the solenoid 145. In addition, when system 100 has a hang-up condition, a user does not have to shut down power to the POS terminal (e.g., physically pull the power cord from a wall socket) in order to prevent voltage to be continually provided to the solenoid 145.

According to an embodiment, the controller circuit 120 includes a clock or timer that can be adjustable or configurable by the user via the BIOS 115 settings. The clock or timer of the controller circuit 120 can be leveraged/used to provide the pulse signal 160 with a predetermined duration. For example, a default predetermined duration of the pulse signal 160 can be initially set by a manufacturer of the system 100 (e.g., 150 ms). However, a user can change the predetermined duration of the pulse signal 160 by accessing the BIOS 115 settings (e.g., by pressing a F10 key on a keyboard when the POS terminal is booting up). The BIOS 115 includes a user interface feature that can be displayed on a display device of the POS terminal (e.g., the display device can be coupled to system 100 via a connector) to enable a user to after settings for various devices of system 100. For example, a user can configure hardware, set the system clock, enable or disable system components, or set passwords using the user interface feature. From the BIOS 115 user interface feature, the user can select and adjust the pulse signal 160 settings (e.g., duration, voltage of the pulse signal 160) depending on user preference via the input mechanisms. For example, the duration of the pulse signal 160 can be set anywhere from 40 ms to 300 ms.

A user of the POS terminal may want to after the duration of the pulse signal 160 for a variety of different reasons. For example, the cash drawer 140 may be a drawer that is purchased separately from the actual POS terminal (e.g., may be manufactured by a different party than the manufacturer of the POS terminal) and may have different requirements for opening the cash drawer 140 than a cash drawer 140 that is integrated with the POS terminal (or that is manufactured by the same manufacturer of the POS terminal). In this case, a user may want to extend the amount of time that voltage is applied to the solenoid 145 (e.g., 200 ms instead of 150 ms) to ensure that the cash drawer 140 can be opened. In another example, the cash drawer 140 may be used in a foreign country where metal coins are more popularly used as physical currency (e.g., in European countries). In such cases, the cash drawer 140 may hold a large number of coins which causes the cash drawer 140 to be heavier. To cause the cash drawer 140 to be opened at such weights, the user may also want to extend the amount of time that voltage is applied to the solenoid 145 to ensure that the cash drawer 140 can be opened despite the large number of coins.

Methodology

Figure 2:
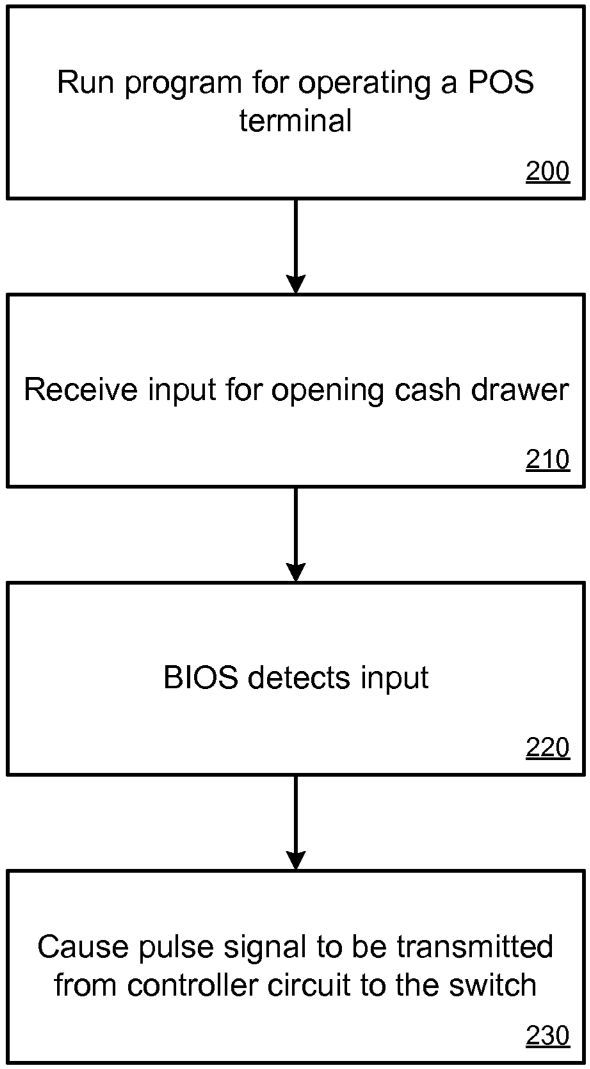
FIG. 2 illustrates an example method for providing a BIOS pulse control for a point-of-sale terminal, under an embodiment.
Figure 3:
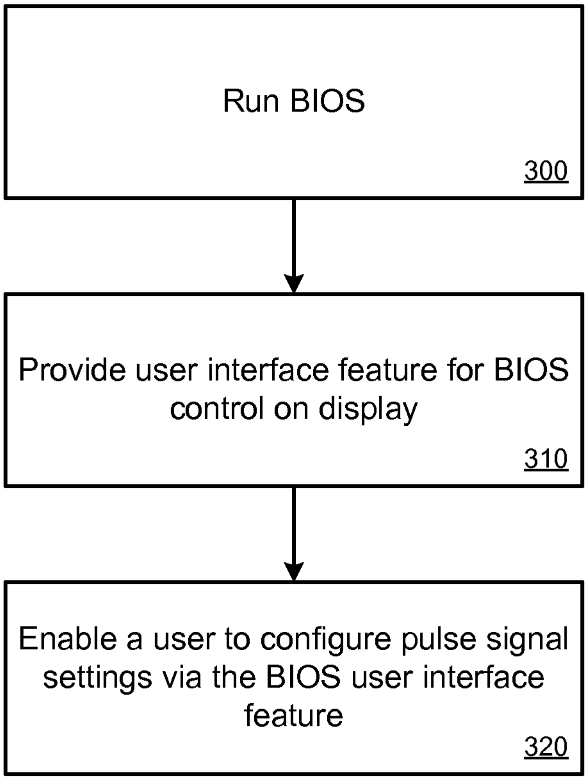
FIG. 3 illustrates an example method for configuring a pulse signal for a system, under an embodiment.

Methods such as described by an embodiment of FIGS. 2 and 3 can be implemented using, for example, components described with an embodiment of FIG. 1. Accordingly, references made to elements of FIG. 1 are for purposes of illustrating a suitable element or component for performing a step or sub-step being described. FIG. 2 illustrates an example method for providing a BIOS pulse control for a point-of-sale terminal, under an embodiment.

In an embodiment, one or more processors communicate with memory resources to run a program for operating a POS terminal (step 200). One or more memory resources can store instructions and/or programs that are executable by the one or more processing components for running an OS and/or one or more programs for operating the POS terminal. As described with an embodiment of FIG. 1, a user can access one or more programs that are running on the POS terminal to perform financial transactions. The program(s) and/or OS of the system can enable the user to enter/scan product barcodes, can automatically perform calculations (e.g., compute discounts, adding totals, tax computations), or can programmatically cause a receipt to be printed from an attached printer.

The user can provide an input via a user mechanism (such as a mouse or keyboard coupled to the system) to open a cash drawer that is coupled to or integrated with the POS terminal (step 210). For example, when the user is operating the program and/or OS of the system, the user may press a button(s) on a keyboard may have a button(s) that, when pressed, causes the system to determine that the user requested the cash drawer to be opened. When the user provides an input to open the cash drawer, the program and/or OS of system signals or notifies the BIOS of the system that the user has provided an the input to open the cash drawer.

The BIOS detects the input and signals the controller circuit of the system in order to cause the cash drawer to be opened (step 220). The BIOS controls the controller circuit to send a pulse signal to a switch (e.g., the BIOS can flip a bit in the controller circuit) (step 230). As described in an embodiment of FIG. 1, the switch can be coupled to the controller circuit and a connector (e.g., a RJ12 telephone cable interface) so that voltage provided to the switch from a voltage regulator module can be provided to the connector. The pulse signal has a predetermined (and user-adjustable via the BIOS settings) duration (e.g., logical low, then logical high for 150 ms, and then back to logical low) that causes the switch to change states for the duration of the pulse signal. For example, if the controller circuit is set to provide a pulse signal with a duration of 200 ms, the switch will change states (from on to off, or vice versa, for example) for a similar amount of time so that voltage (e.g., 24V) can be provided to the solenoid (via the connector) for a similar amount of time. Because the controller circuit provides the pulse signal for a certain duration, voltage can be prevented from being applied to the solenoid after the duration of the pulse signal. The user can also FIG. 3 illustrates an example method for configuring a pulse signal for a system, under an embodiment. FIG. 3 may be an addition or may be part of the method as described with FIG. 2. The system, as described in an embodiment of FIG. 1, can be used to control a pulse signal for opening a cash drawer. The pulse signal can be adjusted or configured for depending on user preference.

According to an embodiment, a user of a POS terminal can run or operate the BIOS stored in the system of the POS terminal (step 300). When the POS terminal is powered on or booted up, for example, the user can press a button to enter the BIOS setup mode or settings (e.g., press F10). The BIOS can enable the user to configure and after various settings for different components of the system.

In one embodiment, the BIOS includes a user interface feature that is provided on a display device of the POS terminal (e.g., a display screen that is coupled to the system via a connector) (step 310). The user interface feature for the BIOS can be accessed via one or more user interface mechanisms, such as a keyboard. Using the keyboard, for example, a user can navigate various options and settings that are provided on the user interface feature for the BIOS (e.g., choose settings or options to enable or disable various system components, set passwords, change system clock).

From the user interface feature of the BIOS, the user is enabled to configure the pulse signal settings for opening the cash drawer (320). In one embodiment, the controller circuit includes a clock or timer that can be adjustable or configurable by the user via the BIOS settings. The clock or timer of the controller circuit can be used to provide the pulse signal with a predetermined duration. This duration can be adjusted or altered using the user interface feature of the BIOS (e.g., change from 40 ms to 150 ms to 200 ms, etc.). This enables the user to change the pulse signal settings depending on user preference. The user can repeatedly change these settings, save the settings, and exit the BIOS settings once completed.

It is contemplated for embodiments described herein to extend to individual elements and concepts described herein, independently of other concepts, ideas or system, as well as for embodiments to include combinations of elements recited anywhere in this application. Although embodiments are described in detail herein with reference to the accompanying drawings, it is to be understood that the invention is not limited to those precise embodiments. As such, many modifications and variations will be apparent to practitioners skilled in this art. Accordingly, it is intended that the scope of the invention be defined by the following claims and their equivalents. Furthermore, it is contemplated that a particular feature described either individually or as part of an embodiment can be combined with other individually described features, or parts of other embodiments, even if the other features and embodiments make no mentioned of the particular feature. This, the absence of describing combinations should not preclude the inventor from claiming rights to such combinations.

What is claimed is:

1. A system comprising:
- a super I/O controller circuit;
- a voltage regulator;
- a switch to receive input from the super I/O controller circuit and the voltage regulator;
- one or more processors; and
- one or more memory resources storing a basic input/output system (BIOS), the one or more memory resources further storing instructions that, when executed by the one or more processors, cause the system to:
  - detect a user input to unlock a cash drawer operable by a solenoid of a point of sale (POS) terminal; and
  - in response to the user input, (i) cause the voltage regulator to generate and transmit a voltage signal, having a predetermined voltage, to the switch, and (ii) run the BIOS to assert the super I/O controller circuit to generate and transmit a pulse signal, having a configurable duration, to the switch, causing the switch to transmit the voltage signal to the solenoid for the configurable duration;
  - wherein the transmitted voltage signal causes the solenoid to change states and unlock the cash drawer.

2. The system of claim 1, wherein the super I/O controller circuit comprises an internal timer, and wherein the configurable duration of the pulse signal is based, at least in part, on the internal timer.

3. The system of claim 2, wherein the configurable duration of the pulse signal is configurable via a user interface of the BIOS, the user interface providing access to BIOS settings enabling a user to configure or adjust the internal timer to set the configurable duration of the pulse signal.

4. The system of claim 3, wherein the user interface further enables the user to configure or adjust the predetermined voltage of the voltage signal.

5. The system of claim 1, wherein the pulse signal causes the voltage signal to be transmitted to the solenoid by changing states of the switch coupled to the super I/O controller circuit.

6. The system of claim 1, further comprising a physical interface coupled to the switch, wherein the cash drawer is coupled to the physical interface.

7. The system of claim 1, wherein the switch is a transistor.

8. The system of claim 1, further comprising a display screen, and one or more input mechanisms.

9. A point-of-sale (POS) terminal comprising:
- one or more input mechanisms;
- a cash drawer operable by a solenoid; and
- a system comprising:
  - a controller circuit;
  - a voltage regulator;
  - a switch to receive input from the controller circuit and the voltage regulator;
  - one or more processors; and
  - one or more memory resources storing a basic input/output system (BIOS), the one or more memory resources further storing instructions that, when executed by the one or more processors, cause the system to:
    - detect, from the one or more input mechanisms, a user input to unlock the cash drawer; and
    - in response to the user input, (i) cause the voltage regulator to generate and transmit a voltage signal, having a predetermined voltage, to the switch, and (ii) run the BIOS to assert the controller circuit to generate and transmit a pulse signal, having a configurable duration, to the switch, causing the switch to transmit the voltage signal to the solenoid for the configurable duration;

wherein the transmitted voltage signal causes the solenoid to change states and unlock the cash drawer; and wherein the configurable duration of the pulse signal is configurable via a displayable user interface of the BIOS, the user interface providing access to BIOS settings enabling a user to configure or adjust an internal timer to set the configurable duration of the pulse signal.

10. The POS terminal of claim 9, wherein the controller circuit comprises the internal timer, and wherein the configurable duration of the pulse signal is based, at least in part, on the internal timer.

11. The POS terminal of claim 9, wherein the pulse signal causes the voltage signal to be transmitted to the solenoid by changing states of the switch coupled to the controller circuit.

12. The POS terminal of claim 9, wherein the system further comprises a physical interface coupled to the switch, and wherein the cash drawer is coupled to the physical interface.

13. A method of operating a point-of-sale (POS) terminal, the method performed by one or more processors of the POS terminal and comprising:

detecting a user input to unlock a cash drawer coupled to the POS terminal, the cash drawer operable by a solenoid; and in response to the user input, (i) causing a voltage regulator of the POS terminal to generate and transmit a voltage signal, having a configurable voltage, to a switch, and (ii) running a basic input/output system (BIOS), stored in a memory resource of the POS terminal, to assert a controller circuit to generate and transmit a pulse signal, having a duration configurable via a graphical user interface of the BIOS, to the switch, causing the switch to transmit the voltage signal to the solenoid for the configurable duration;

wherein the transmitted voltage signal causes the solenoid to change states and unlock the cash drawer.

14. The method of claim 13, wherein the user input to open the cash drawer is provided by a user via the graphical user interface of the BIOS.

15. The method of claim 13, wherein the solenoid comprises an electromechanical solenoid.

16. The method of claim 13, wherein the solenoid comprises a rotary solenoid.

17. The method of claim 14, wherein the configurable duration of the pulse signal is configurable via the graphical user interface of the BIOS, the graphical user interface providing access to BIOS settings enabling the user to configure or adjust an internal timer, operable on the controller circuit, to set the configurable duration of the pulse signal.

18. The method of claim 17, wherein the graphical user interface further enables the user to configure or adjust the configurable voltage of the voltage signal.

* * * * *